United States Patent
Waldie et al.

(10) Patent No.: US 6,504,410 B2
(45) Date of Patent: Jan. 7, 2003

(54) FAULT TOLERANT STORAGE CELL

(75) Inventors: Arthur Howard Waldie, Albuquerque, NM (US); Robert Ward James, Albuquerque, NM (US); Timothy John Canales, Albuquerque, NM (US); Michael L. White, Oak Harbor, WA (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 09/829,139

(22) Filed: Apr. 9, 2001

(65) Prior Publication Data

US 2001/0038304 A1 Nov. 8, 2001

Related U.S. Application Data

(60) Provisional application No. 60/203,196, filed on May 11, 2000.

(51) Int. Cl.$^7$ ................................................ H03K 3/12
(52) U.S. Cl. ........................ 327/199; 327/33; 327/198; 326/10; 326/14; 375/357
(58) Field of Search ......................... 327/188, 198–202, 327/216–218, 292, 18, 22, 20, 33, 34, 38; 326/9–14; 365/154, 156, 206, 210; 375/357

(56) References Cited

U.S. PATENT DOCUMENTS 4,239,982 A * 12/1980 Smith et al. ................ 327/142
4,375,683 A * 3/1983 Wensley ...................... 714/12
4,979,191 A * 12/1990 Bond et al. .................. 375/357
5,144,230 A * 9/1992 Katoozi et al. .............. 324/537

OTHER PUBLICATIONS

Temporally Redundant Latch for Preventing Single Event Disruptions in Sequential Integrated Circuits, Dr. David G. Mavis and Paul H. Eaton, Technical Report P8111.29 published by Mission Research Corporation; Sep. 8, 1998 and revised on Oct. 8, 1998.

* cited by examiner

Primary Examiner—Timothy P. Callahan
Assistant Examiner—Minh Nguyen
(74) Attorney, Agent, or Firm—David R. Percio; Calfee, Halter & Griswold LLP

(57) ABSTRACT

A storage cell of an integrated circuit is operable in a radiation environment to capture and store at predetermined time intervals a time sample of a data input signal. A signal representative of the stored data sample for each time interval is generated at an output of the storage cell. At least three data capturing circuits operate to capture and store a time sample of the data input signal at each predetermined time interval, the stored data sample of each circuit being generated correspondingly at an output thereof. Coupled to the outputs of the data capturing circuits is a circuit for generating a signal representative of a stored data sample selected from at least two of the circuit outputs. Also coupled to the data capturing circuits is a circuit for causing each data capturing circuit to capture a different time sample of the input data signal from the other data capturing circuits over each predetermined time interval.

21 Claims, 2 Drawing Sheets

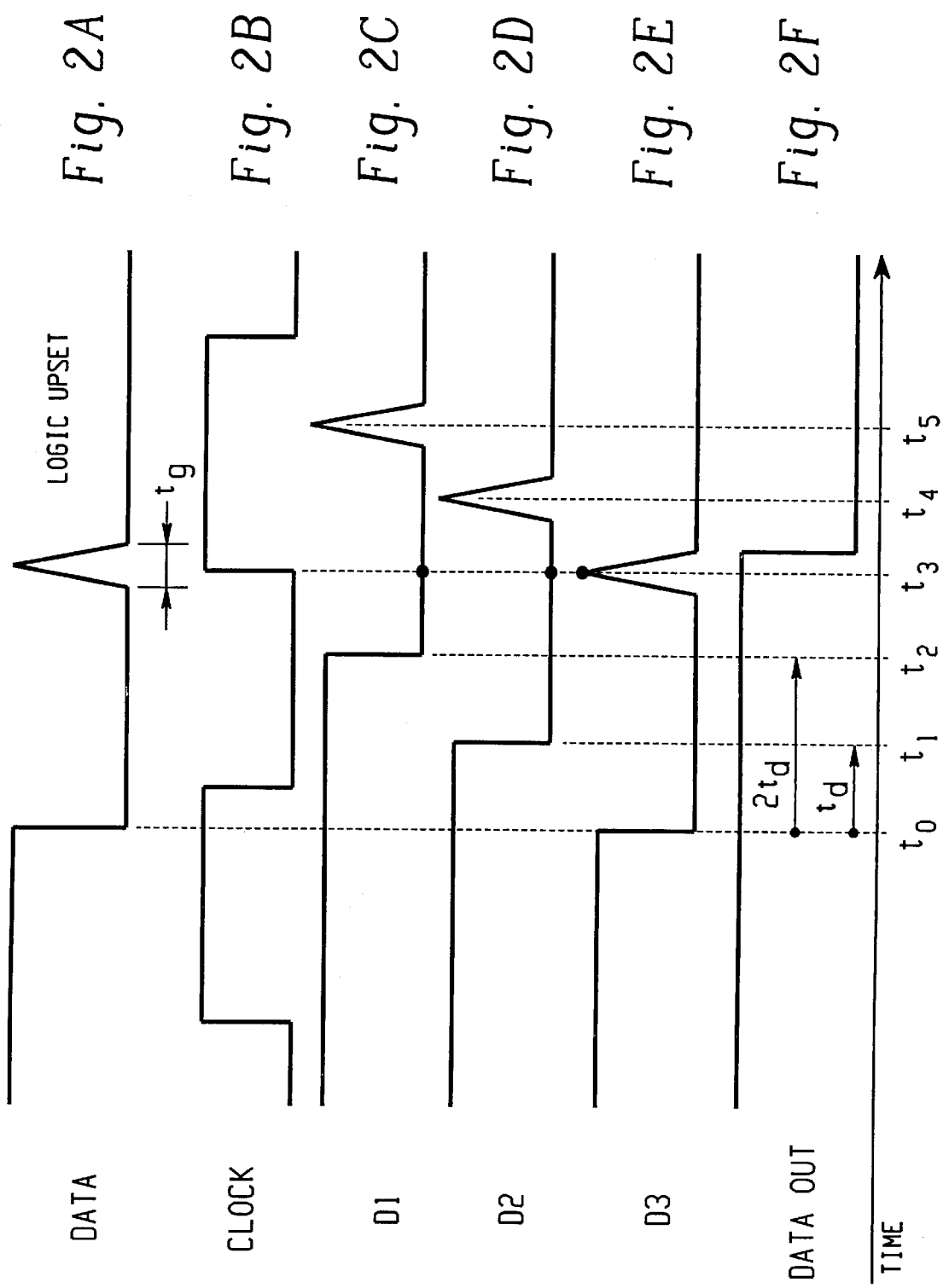

FAULT TOLERANT STORAGE CELL

This application claims priority from U.S. Provisional Application Serial No. 60/203,196 filed May 11, 2000.

BACKGROUND OF THE INVENTION

The present invention is directed to storage cells of integrated circuits operating in a radiation environment, in general, and more particularly, to such storage cells that are tolerant of an upset fault, momentary or otherwise, caused by a radiation particle.

In radiation environments, radiation particles, like high energy particles and protons, for example, may cause logic circuits to incur upset faults under the same or different mechanisms. This problem of radiation logic upset is particularly severe in circuits utilized in spacecraft and high flying aircraft which operate in environments lacking in atmosphere. In these environments, there is substantially no atmosphere or very little atmosphere to absorb the radiation particles and thus, a higher density of particles may make contact with the logic circuits on-board such craft.

In addition, the problem is made even more critical by the substantial reduction in the integrated circuit geometries of the logic circuits which are currently approaching less than 0.5 microns, for example. When the geometries were greater than one micron, for example, the likelihood of a radiation particle logic upset was less severe. But, as these geometries shrank into the sub-micron dimensions, the likelihood of a radiation particular logic upset became greater. With geometries of less than 0.5 microns, this problem has become of paramount importance.

Currently, in storage cells of integrated circuits operating in a radiation environment, a triple voted circuit is used to mitigate the risks of a radiation upset causing a fault in the stored signal thereof. A triple voted circuit may be comprised of three latching registers configured in parallel with the data input signal of the storage cell coupled to the data inputs thereof. The three latching circuits are operated synchronously by a common clock signal to capture and store the same time sample of the input data signal. The data outputs of the latching registers may be coupled to a majority vote circuit which generates the stored signal of the storage cell. If any one of the latching registers incurs a radiation particle upset, it will be out-voted by the other two which produce the same and correct output. Accordingly, the storage cell output remains substantially unaffected by any single event upset to one of the storage registers thereof.

However, it is recognized that the radiation particle upsets are not limited to latching registers but may extend to the combinatorial logic surrounding the latching registers of a storage cell as well. Although radiation upsets of combinatorial logic circuits are momentary in nature, normally having a duration inversely proportional to the bandwidth of the circuit, for example, they may cause a corresponding momentary state change in the input data signal which is coupled to the data inputs of the three latching registers. Since the three latching registers are latched at the same time, it is possible to latch at the time of the momentary state change of the input data signal in which case, all three outputs of the latching registers will be in error. Thus, a majority vote will not result in the correct output for the storage cell.

With the integrated circuit geometries becoming smaller and smaller into the sub-micron region resulting in a higher frequency of upsets and with the higher operating frequencies of integrated circuits made possible by the smaller processing geometries, the possibility of concurrent latching of a common momentary upset becomes proportionately greater. The present invention provides for an improved integrated circuit storage cell intended to overcome this drawback of the current triple voted storage cell for use on-board spacecraft, high flying aircraft, and the like, which use is susceptible to radiation environments.

SUMMARY OF THE INVENTION

A storage cell of an integrated circuit is operable in a radiation environment to capture and store at predetermined time intervals a time sample of a data input signal. A signal representative of the stored data sample for each time interval is generated at an output of said storage cell. In accordance with the present invention, the storage cell comprises at least three data capturing circuits, each having a data input coupled to the data input signal and operable to capture and store a time sample of the data input signal at each predetermined time interval, the stored data sample of each said circuit being generated correspondingly at an output thereof; means coupled to the outputs of said data capturing circuits for generating at the output of said storage cell a signal representative of a stored data sample selected from at least two of said circuit outputs; and means coupled to said data capturing circuits for causing each data capturing circuit to capture a different time sample of the input data signal from the other data capturing circuits over each predetermined time interval. In one embodiment, the data input signal is a time varying digital signal and each data capturing circuit comprises a latching circuit so that the storage cell may encounter an upset by a radiation particle without affecting substantially the state of the output of the storage cell.

BRIEF DESCRIPTION OF THE DRAWINGS

FIGS. 2A through 2F are time graphs suitable for describing the operation of the embodiment of FIG. 1.

DETAILED DESCRIPTION OF THE INVENTION

Figure 1:
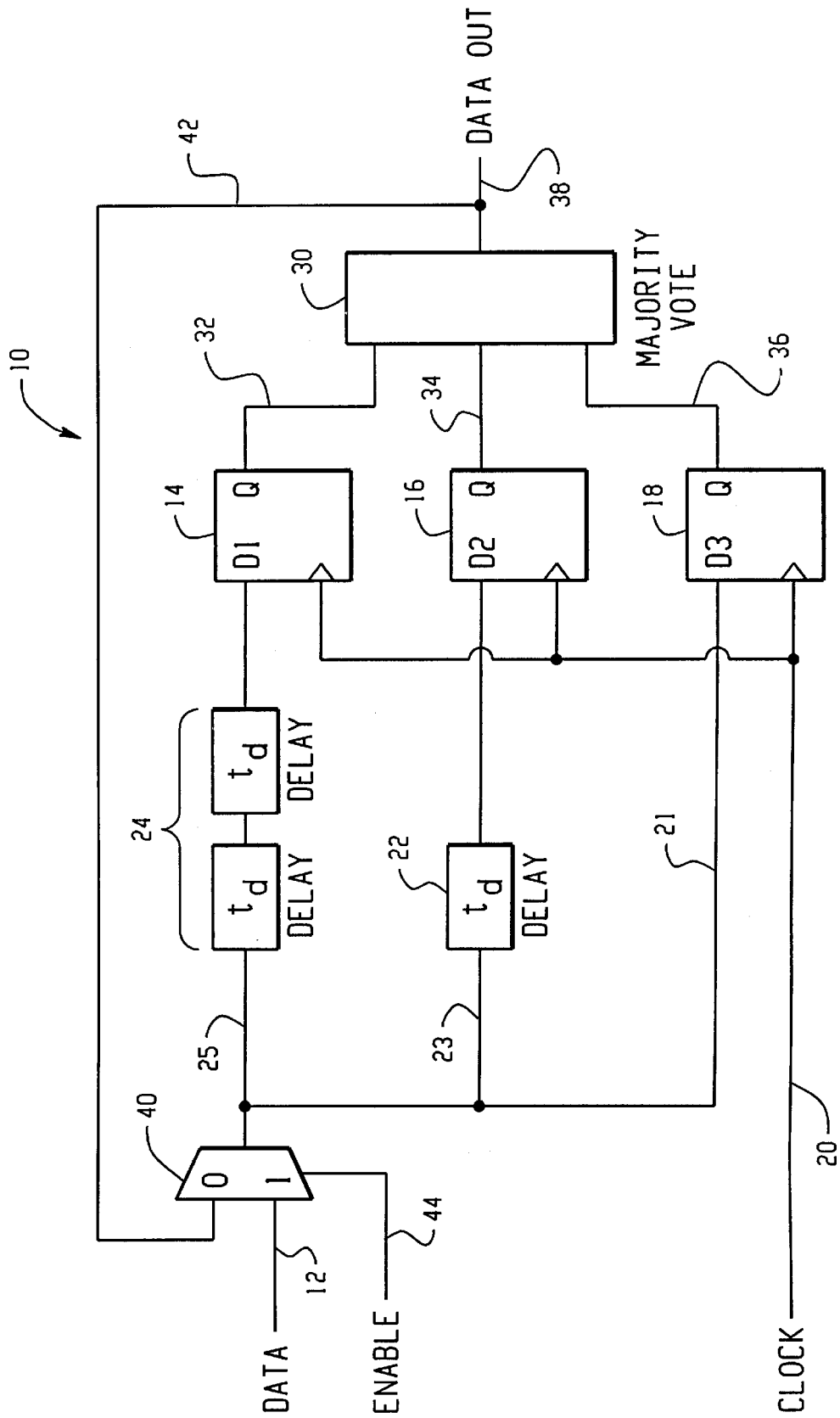
FIG. 1 is a circuit schematic of a storage cell suitable for embodying the principles of the present invention.

FIG. 1 is a circuit schematic of a storage cell 10 suitable for embodying the present invention. The storage cell embodiment of FIG. 1 may be fabricated on an integrated circuit having geometries of sub-micron dimensions, like 0.5 microns or less, for example, with an application of performing digital signal data processing on-board a spacecraft or high flying aircraft which operate in radiation environments. Accordingly, the storage cell 10 is intended to be operable in a radiation environment and able to withstand a single upset event or condition as a result of incurring a radiation particle at any part or component of its circuitry without substantially affecting the data output thereof. In essence the storage cell of the present embodiment is considered fault tolerant to single event upsets from radiation.

Referring to FIG. 1, an input data signal is coupled to an input of the data storage cell 10 over a signal line 12. The input data signal is distributed to data inputs D1, D2 and D3 of three latching circuits or registers 14, 16 and 18, respectively. A common clock signal is applied to the clock inputs of the registers 14, 16 and 18 over a signal line 20. A time delay circuit 22 is disposed in a branch 23 of the signal line 12 at the data input D2 for delaying the input data signal to the data input D2 a time delay $t_d$. Similarly, another delay circuit 24 is disposed in another branch 25 of the signal line 12 at the data input D1 for delaying the input data signal to the data input D1 a time delay $2t_d$. In the present example, the delay circuit 24 is comprised of two series coupled delay circuits, each delaying the input data signal a time delay $t_d$. In the present embodiment, the outputs of the latching registers 14,16 and 18 are coupled to a conventional majority vote circuit 30 over signal lines 32, 34 and 36, respectively. The circuit 30 in turn generates a data output of the storage cell over signal line 38 based on a selection or vote of at least two of the outputs of the latching registers.

While the latching registers 14, 16 and 18 of the present embodiment are shown as D-type flip flops in the schematic of FIG. 1, it is understood that any type of latching register may be used to embody the capture and store function of these devices without deviating from the present invention. Moreover, even though only three registers are used for the present embodiment, it is further understood that more than three may be used without deviating from the present invention, except that it is preferred to limit the number of registers to an odd number. It is also understood that the time delays may be generated in a variety of ways including, but not limited to, circuit layout specifications such as applying different wire lengths for the lines 25, 23 and 21, for example, the insertion of components such as buffers into the signal path connected to 25, 23 and 21 and changing the device types and designs for the devices 14, 16 and 18, for example, thereby inserting time delay characteristics into the circuit paths. In other words, the present invention is not limited in any way, shape or form by the embodiment of the delay function which staggers the application of the signal to the latching registers 14, 16 and 18.

In addition, while the time delay circuits 22 and 24 of the present embodiment delay the input data signal by multiples of the time delay $t_d$, it is further understood that any time delay may be used to stagger the times at which the input data signal is applied to the data inputs of the three data registers 14, 16 and 18, albeit there is always a trade off between speed and performance and the amount of time delay that would be adequate for ensuring against concurrent latching of a logic upset on the input data signal in two or more latching registers. It is preferred that the time delay td be greater than the longest duration of any expected momentary upset in the input data signal.

Still further, the majority vote circuit 30 of the present embodiment may be embodied by any circuit which generates a storage output signal representative of the stored data sample of at least two, i.e. a majority, of the latching circuit outputs. For example, such circuits may be embodied in combinatorial logic satisfying the boolean expression:

V=(A and B) or (B and C) or (C and A), where V is the output of the circuit and A, B and C are the inputs from the three latching registers. Another possible embodiment includes the use of an eight input multiplexer using the outputs of the registers as the address inputs. The data inputs may be programmed as a binary one for addresses which include two or more binary ones and programmed as a binary zero for addresses which include two or more binary zeros. Yet another embodiment may include an eight bit look-up table having the latching register outputs as the address. The look up table would be programmed to operate in much the same way as the multiplexer operates. Accordingly, there are many ways in which a majority vote circuit may be embodied and expanded to satisfy any odd number of latching register in the storage cell.

In operation, one transition edge of the clocking signal 20 applied to the clock inputs of the latching circuits 14, 16 and 18 causes each circuit to capture and store at its output a sample of the input data signal that is applied to its data input concurrent with the clock edge. The circuit 30 then generates a storage cell output signal based on a majority vote of the latched outputs of the registers 14, 16 and 18. Therefore, if any one of the latching registers 14, 16 or 18 incurs a radiation produced upset or single event upset, the state of its output may be temporarily changed to an error state. However, the output states of the other two registers will remain at the correct state. Accordingly, the error in the output of one of the registers will be out-voted by the correct state of the other two registers as determined by the circuit 30 and the storage cell output will remain unaffected.

It is understood that the circuitry surrounding the latching registers, like the circuit 30, delay circuits 22 and 24 and the interconnecting circuitry, for example, is considered of the combinatorial type which will incur only a momentary upset as a result of particle radiation. Thus, if the input data signal of the present embodiment incurs a momentary upset as a result of a radiation particle, the momentary upset will not be applied to the data inputs of the latching registers at the same time because of the delay circuits 22 and 24 and therefore, will not be latched to more than one register of the registers 14, 16 and 18. The time graphs of FIGS. 2A through 2F provide an example of this operation.

In FIG. 2A, the input data signal is shown as a digital signal changing states at time $t_0$ from a high or one state to a low or zero state. Note that as shown by FIGS. 2E, 2D and 2C, the transition of the data signal will appear at the data inputs D3, D2 and D1 at staggered times $t_0$, $t_1$, and $t_2$, respectively, as a result of the time delay circuits 22 and 24. Similarly, a logic upset on the data signal occurring at time $t_3$, for example, as shown in FIG. 2A will not be applied to the data inputs D2 and D3 until times $t_4$ and $t_5$, respectively, as shown by FIGS. 2D and 2C. Should the latching transition of the clock signal occur during the logic upset at time $t_3$ as shown by the time graph of FIG. 2B, it will cause the registers 14 and 16 to capture and store the correct logic state of zero and will cause the register 18 to capture and store an error state of one as a result of the logic upset to the input data signal. The error state of one will be out-voted by the two zero states as determined by the circuit 30 which generates the correct storage cell output signal shortly after the clock transition of time $t_3$ as shown by the time graph of FIG. 2F. In this manner, the storage cell of the present embodiment is able to withstand a single event upset without affecting substantially the output signal thereof.

In accordance with another aspect of the present invention, a refresh circuit governed selectively by the storage cell output signal to clear an upset condition from the storage cell 10 is included in the embodiment described in connection with FIG. 1. Referring back to FIG. 1, a multiplexer circuit 40 has coupled to its inputs the input data signal over line 12 and the cell output signal over line 42. The output of the multiplexer circuit 40 is coupled to the data inputs of the three registers over the line branches 21, 23 and 25 via delay circuits 22 and 25 for branches 23 and 25, respectively. A select signal is applied to the multiplexer circuit 40 over signal line 44 for selecting one of the input data signal or output cell signal for conduction to the data inputs of the three registers based on the signal state thereof. In operation, when the storage cell is enabled to latch new data over signal line 12, the select signal 44 is in a state to cause the multiplexer circuit 40 to conduct the input data signal to the latching registers. Accordingly, at the next latching clock transition, the new data will be captured and latched by the registers 14, 16 and 18. When the storage cell is in the dormant state, the select signal is in the disabled state causing the circuit 40 to conduct the cell output signal to the data inputs of the latching registers. In this dormant state, if one of the registers becomes upset to an error state, it will be cleared or refreshed by the correct output signal at the next latching clock transition. This clearing of the latching registers will continue to occur during the period of dormancy of the storage cell or until it is again enabled and the circuit 40 is switched to select the input data signal by the select signal 44.

In an alternate embodiment, the multiplexer 40 may be a $2^N$ bit wide multiplexer in which case the select lines 44 could accommodate multiple select signals for selecting any one of the $2^N$ input data signals which may be coupled thereto.

In addition, in integrated circuits, storage cells may be serially coupled together in a chain of 2 or more cells. That is, the output of one connected to the data input of another. In these cases, a single event upset may be transmitted from one cell to another and possibly ripple through to many cells. The aspect of the present invention of time staggering of the input data signal to the data inputs of the latching registers of each cell through use of delay circuits in order to ensure against concurrent latching of a momentary upset event on the nput data signal by at least two of the registers is intended to obviate these situations as well.

While the present embodiment accomplishes a time staggering of the input data signal to the data inputs of the latching registers through use of delay circuits in order to ensure against concurrent latching of a momentary upset event on the input data signal by at least two of the registers, it is understood that other embodiments are possible for achieving the same purpose. Accordingly, the present embodiment is not intended to be limited to any single embodiment, but rather construed in breadth and broad scope in accordance with the recitation of the appended claims

What is claimed is:

1. A storage cell of an integrated circuit operable in a radiation environment to capture and store at predetermined time intervals a time sample of a data input signal, a signal representative of the stored data sample for each time interval being generated at an output of said storage cell, said storage cell comprising:

at least three data capturing circuits, each having a data input coupled to the data input signal and operable to capture and store a time sample of the data input signal at each predetermined time interval, the stored data sample of each said circuit being generated correspondingly at an output thereof;

means coupled to the outputs of said data capturing circuits for generating at the output of said storage cell a signal representative of a stored data sample selected from at least two of said circuit outputs; and means coupled to said data capturing circuits for causing each data capturing circuit to capture a different time sample of the input data signal from the other data capturing circuits over each predetermined time interval.

2. The storage cell of claim 1 wherein the storage cell is of a sub-micron geometry.

3. The storage cell of claim 1 wherein the data input signal is a time varying digital signal; wherein each data capturing circuit comprises a latching circuit; and wherein the storage cell is operative to encounter an upset by a radiation particle without affecting substantially the state of the output of the storage cell.

4. The storage cell of claim 3 wherein the output of any one of the latching circuits is capable of being upset to an error state by a radiation particle.

5. The storage cell of claim 3 wherein the storage cell is capable of being upset by a momentary upset of the data input signal.

6. The storage cell of claim 3 wherein each latching circuit is synchronously clocked by a common clock signal to capture and store the time samples of the input data signal; and wherein the causing means includes a delay means for coupling the data input signal to the data inputs of the latching circuits delayed by different delay times.

7. The storage cell of claim 6 wherein the delay means includes a different time delay circuit coupled to the data inputs of the latching circuits.

8. The storage cell of claim 6 wherein each latching circuit comprises a flip flop circuit.

9. The storage cell of claim 3 including a refresh means governed selectively by said storage cell output signal to clear the upset condition from the storage cell.

10. The storage cell of claim 9 wherein the refresh means includes multiplexer circuit for selectively coupling one of the data input signal and storage cell output signal to the data inputs of the latching circuits.

11. The storage cell of claim 3 wherein the means coupled to the outputs of said data capturing circuits for generating the storage cell output signal comprises a majority vote circuit.

12. A storage cell of an integrated circuit operable in a radiation environment to capture and store at predetermined time intervals a time sample of a data input signal, a signal representative of the stored data sample for each time interval being generated at an output of said storage cell, said storage cell comprising:

three latching circuits, each having a data input coupled to the data input signal and operable to capture and store a time sample of the data input signal at each predetermined time interval, the stored data sample of each said circuit being generated correspondingly at an output thereof;

a majority vote circuit coupled to the outputs of said latching circuits for generating at the output of said storage cell a signal representative of a stored data sample selected from at least two of said circuit outputs; and means coupled to said latching circuits for causing each latching circuit to capture a different time sample of the input data signal from the other latching circuits over each predetermined time interval, whereby the storage cell is operative to encounter an upset by a radiation particle without affecting substantially the output of the storage cell.

13. The storage cell of claim 12 wherein the storage cell is of a sub-micron geometry.

14. The storage cell of claim 12 wherein the data input signal is a time varying digital signal; wherein each latching circuit comprises a flip flop circuit.

15. The storage cell of claim 12 wherein the output of any one of the latching circuits is capable of being upset to an error state by a radiation particle.

16. The storage cell of claim 12 wherein the storage cell is capable of being upset by a momentary upset of the data input signal.

17. The storage cell of claim 12 wherein each latching circuit is synchronously clocked by a common clock signal to capture and store the time samples of the input data signal; and wherein the causing means includes a delay means for coupling the data input signal to the data inputs of the latching circuits delayed by different delay times.

18. The storage cell of claim 17 wherein the delay means includes a different time delay circuit coupled to the data inputs of the latching circuits.

19. The storage cell of claim 12 including a refresh means governed selectively by said storage cell output signal to clear the upset condition from the storage cell.

20. The storage cell of claim 19 wherein the refresh means includes multiplexer circuit for selectively coupling one of the data input signal and storage cell output signal to the data inputs of the latching circuits.

21. A method of operating a storage cell of an integrated circuit in a radiation environment to capture and store at predetermined time intervals a time sample of a data input signal, said method comprising the steps of:

applying the data input signal to data inputs of at least three data capturing circuits;

operating said at least three data capturing circuits to capture and store a time sample of the data input signal at each predetermined time interval;

generating at the output of said storage cell a signal based on a stored data sample of at least two of said data capturing circuits; and causing each data capturing circuit to capture a different time sample of the input data signal from the other data capturing circuits over each predetermined time interval.

* * * * *